(12) United States Patent
Hu

(10) Patent No.: US 9,972,604 B1
(45) Date of Patent: May 15, 2018

(54) JOINT STRUCTURE FOR METAL PILLARS

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days. days.

(21) Appl. No.: 15/440,905

(22) Filed: Feb. 23, 2017

(51) Int. Cl.
*H01L 23/48* (2006.01)
*H01L 23/52* (2006.01)
*H01L 29/40* (2006.01)
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/09* (2013.01); *H01L 24/11* (2013.01); *H01L 24/17* (2013.01); *H01L 24/81* (2013.01); *H01L 25/50* (2013.01); *H01L 2224/0401* (2013.01); *H01L 2224/1162* (2013.01); *H01L 2224/11464* (2013.01); *H01L 2224/11614* (2013.01); *H01L 2224/11616* (2013.01); *H01L 2224/13016* (2013.01); *H01L 2224/13111* (2013.01); *H01L 2224/13144* (2013.01); *H01L 2224/13147* (2013.01); *H01L 2224/13155* (2013.01); *H01L 2224/16104* (2013.01); *H01L 2224/16113* (2013.01); *H01L 2224/16148* (2013.01); *H01L 2224/81191* (2013.01); *H01L 2224/81193* (2013.01); *H01L 2224/81815* (2013.01); *H01L 2225/06513* (2013.01)

(58) Field of Classification Search
None
See application file for complete search history.

(56) References Cited

U.S. PATENT DOCUMENTS

| | | | |
|---|---|---|---|
| 7,569,935 B1 * | 8/2009 | Fan | H01L 24/16 257/737 |
| 9,462,690 B1 | 10/2016 | Darveaux et al. | |
| 2007/0025079 A1 * | 2/2007 | Salmon | G02B 6/43 361/688 |
| 2007/0148960 A1 * | 6/2007 | Park | H01L 21/76849 438/622 |
| 2008/0073795 A1 | 3/2008 | Kohl et al. | |
| 2012/0098143 A1 * | 4/2012 | Wang | H01L 24/11 257/774 |
| 2014/0008814 A1 * | 1/2014 | Chen | H01L 23/481 257/774 |
| 2016/0035711 A1 * | 2/2016 | Hu | H05K 1/14 257/686 |

* cited by examiner

*Primary Examiner* — Calvin Choi
(74) *Attorney, Agent, or Firm* — JCIPRNET

(57) ABSTRACT

A female structure embedding a first metal pillar and a male structure embedding a second metal pillar. The female structure and the male structure can be locked in with each other, the embedded first metal pillar electrically coupled to the second metal pillar through a metal block. The metal block is electrically coupled to a bottom surface of the first metal pillar, and the metal block wraps peripheral surface of a top end of the second metal pillar. A first embodiment shows the metal block is formed by electroless deposition after matching the female structure to the male structure. A second embodiment shows the metal block is a solder joint.

14 Claims, 8 Drawing Sheets

US 9,972,604 B1

JOINT STRUCTURE FOR METAL PILLARS

BACKGROUND

Technical Field

The present invention relates to a joint structure for electrically coupling a first metal pillar of a first electronic device to a second metal pillar of a second electronic device, especially relates to a joint structure formed by a female structure and a male structure.

Description of Related Art

FIG. 1 is a prior art.

Copper Pillar Bump (CPB) is a next generation interconnect for semiconductor packages which offers advantages including highly improved electron-migration resistance, reducing power loss and signal delay, improving current flexibility and heat dissipation performance for fine pitch application (e.g. ≥50 um).

FIG. 1 is a prior art US20080073795A1 which illustrates a joint structure 200. The joint structure 200 comprises a joint structure 215 located between a first and a second pillar sections 205, 210. Also as shown, the joint structure 215 has a greater diameter relative to the diameter of the first pillar section 205 and the second pillar section 210. A joint structure 215 with a diameter greater than pillar sections 205, 210 enables the capability to create a bond between pillar sections 205, 210 that are misaligned such that the central axes of pillar sections 205, 210 are not substantially aligned. As shown in FIG. 1, lines A-A and B-B illustrates misalignment between pillar sections 205, 210 in that the sidewalls of the pillar sections 205, 210 are not substantially aligned. Due to the diameter of the joint structure 215 being greater than that of the pillar sections 205, 210, it is possible to provide an interconnection 200 having misaligned portions.

The disadvantage for the prior art is relatively lower bonding reliability for the joint structure 215 due to tiny bonding surface of pillar sections 205, 210. The diameter is around 55 micrometer for each of the pillar sections 205, 210 according to the passage of the prior art. According to the fast growing technology for semiconductor package, higher and higher density for metal pillars are adopted for semiconductor electronic device. A more reliable joint structure for semiconductor device is desirable.

DETAILED DESCRIPTION OF THE INVENTION

Figure 1:
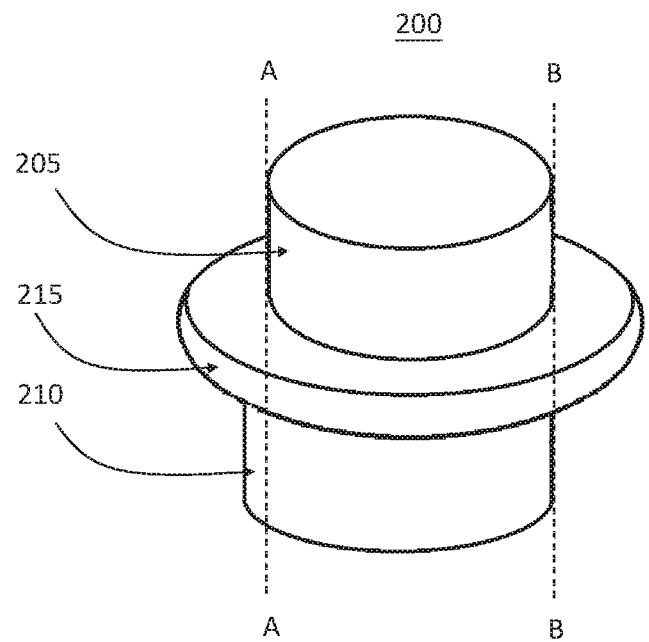
FIG. 1 is a prior art.
Figure 2A:
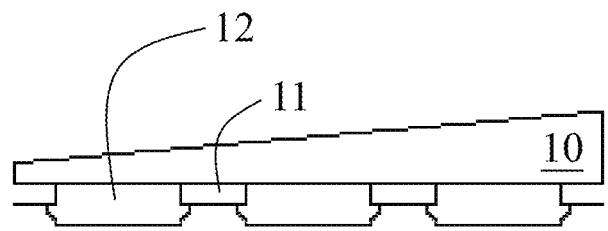
FIGS. 2A~3B show a process for fabrication of metal pillars.
Figure 2B:
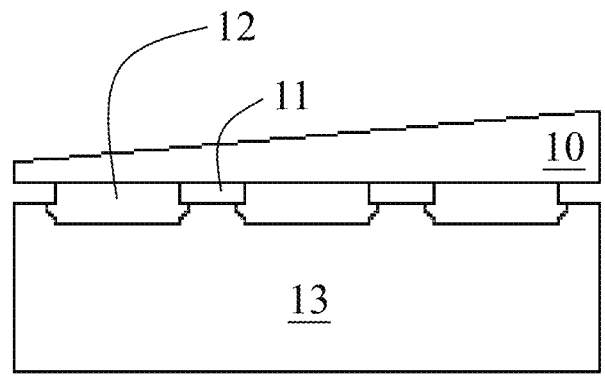
Figure 2C:
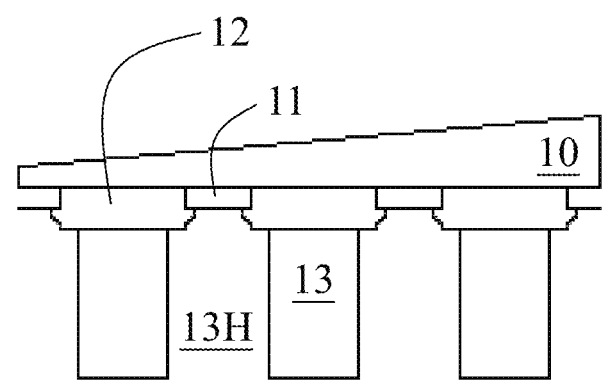
Figure 2D:
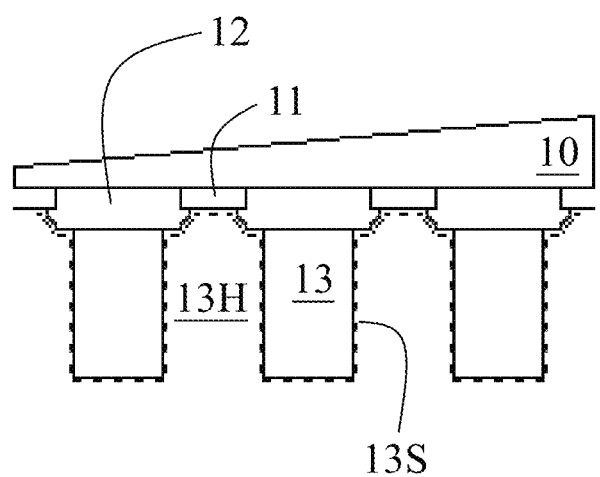

A female structure embedding a first metal pillar and a male structure embedding a second metal pillar. The female structure and the male structure can be locked in with each other, the embedded first metal pillar electrically coupled to the second metal pillar through a connection metal block. The metal block contacts a bottom surface of the first metal pillar and the metal block wraps peripheral surface of a top end of the second metal pillar.

A first embodiment shows the connection metal block is formed by electroless deposition after matching the female structure to the male structure.

A second embodiment shows the connection metal block is a solder joint. The solder joint is formed by reflow a solder layer which is filled by screed printing process.

FIGS. 2A~3B show a process for fabrication of metal pillars.

FIG. 2A shows

Preparing a first electronic component 10 which comprises a plurality of metal pads 11 formed on a bottom side. A passivation layer 12 is formed on a bottom side of the plurality of first metal pads 11. A bottom surface of each metal pad 11 is exposed from bottom side of the passivation layer 12.

FIG. 2B shows

Forming a photoresist layer 13 on a bottom surface of the plurality of metal pads 11.

FIG. 2C shows

Forming a plurality of holes 13H from a bottom side of the photoresist layer 13. A bottom surface of each metal pad 11 is exposed in a corresponding hole 13H.

FIG. 2D shows

Forming seed layer 13S on the surface of each hole 13H and on the bottom surface of each exposed metal pad 11.

FIG. 3A shows

Filling metal into each hole 13H to form a plurality of metal pillars 14. Metal plating can be one of the choices to fill metal into the hole 13H.

FIG. 3B shows

Flattening a bottom surface of the plurality of metal pillars 14 from bottom. Grounding or chemical mechanical polishing (CMP) can be one of the choices for the flattening.

Figure 4A:
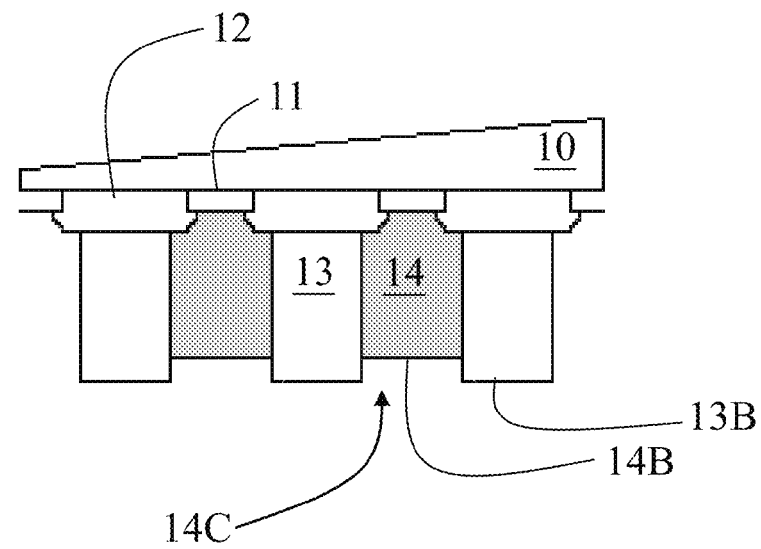
FIG. 4A shows a female structure according to the present invention.

FIG. 4A shows a female structure according to the present invention.

FIG. 4A shows

Figure 3A:
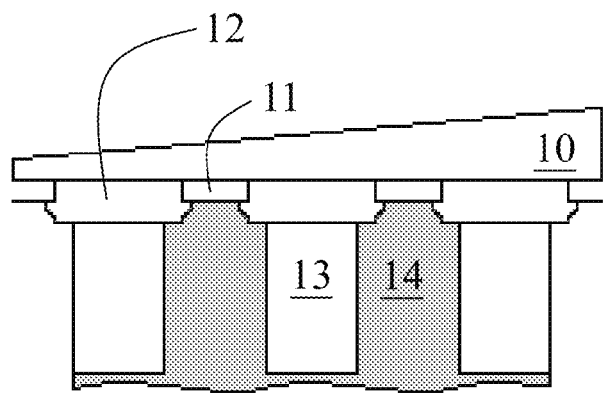
Figure 3B:
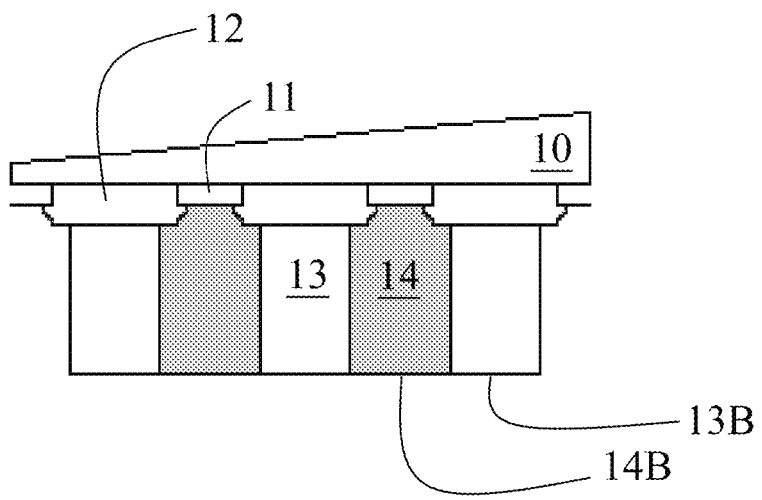

Forming a female structure 100 through etching the embedded metal pillar 14 from bottom side of the product shown in FIG. 3B. FIG. 4A shows that a blind hole 14C is formed under each corresponding metal pillar 14 so that the bottom surface 14B of each metal pillar 14 is higher than a bottom surface 13B of the dielectric material 13.

Figure 4B:
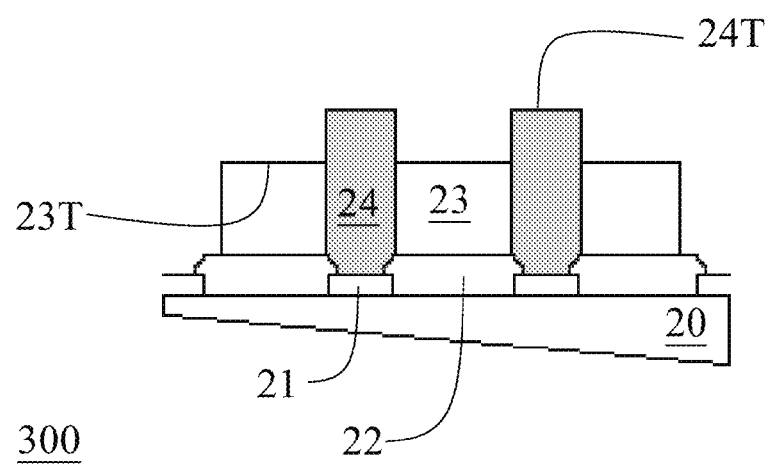
FIG. 4B shows a male structure according to the present invention.

FIG. 4B shows a male structure according to the present invention.

FIG. 4B shows

Forming a male structure 200 through etching the dielectric material 13, from bottom side of the product shown in FIG. 3B. FIG. 4B shows after etching, a top surface 24T of the metal pillar 24 is higher than a top surface 23T of the dielectric material 23. The metal pillar 24 is protruded above the top surface 23T of the dielectric material 23. The dielectric material 13, 23 is the photoresist layer 13 (FIG. 3B) according to the present invention.

Comparing FIG. 4A with FIG. 4B, the first metal pillar 14 in the female structure 100 is made with a diameter greater than a diameter of the second metal pillar 24 in the male structure 300. So that the blind hole 14C, aligned with the first metal pillar 14, is big enough to accommodate the second metal pillar 24 for insertion.

Figure 5A:
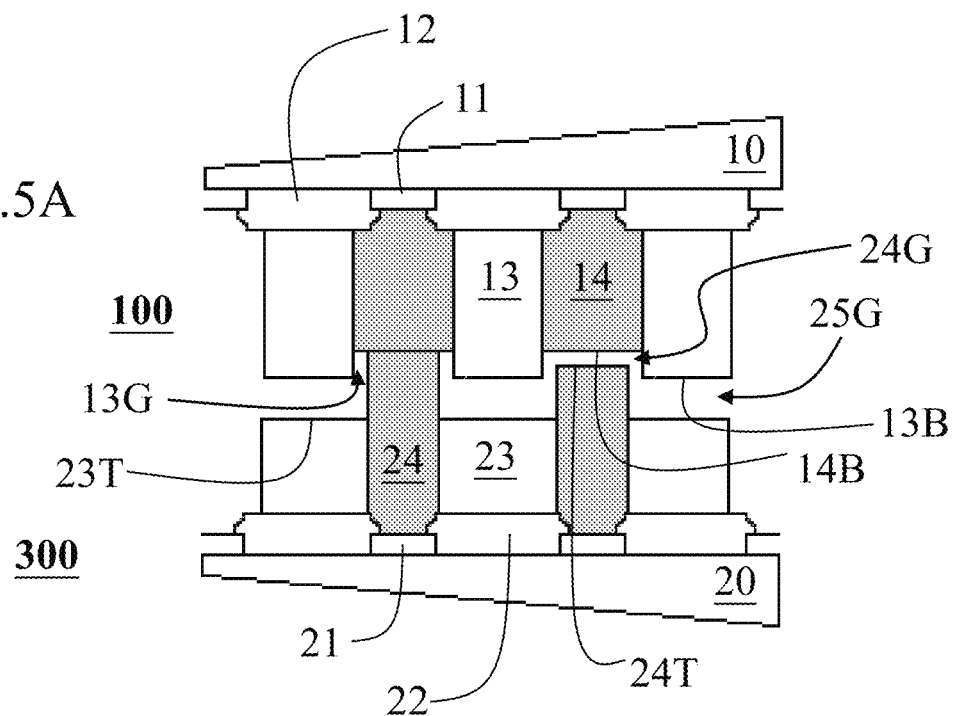
FIG. 5A shows matching the female structure to the male structure according to the present invention.

FIG. 5A shows matching the female structure to the male structure according to the present invention.

FIG. 5A shows

Matching the female structure 100 to the male structure 300. For the left metal pillars 14, 24 of FIG. 5A:
A bottom surface 14B of the first metal pillar 14 contacts a top surface 24T of the second metal pillar 24.

For the right metal pillars 14, 24 of FIG. 5A:
A gap 24G may occur between the bottom surface 14B and the top surface 24T due to process deviation.

A circular gap 13G is formed between the second metal pillar 24 and the first dielectric material 13 within the blind hole 14C. A height of the protrusion of the second metal pillar 24 is greater than a depth of the circular gap 13G so that a gap 25G is formed between the first dielectric material 13 and the second dielectric material 23 after matching the female structure 100 to the male structure 200.

Figure 5B:
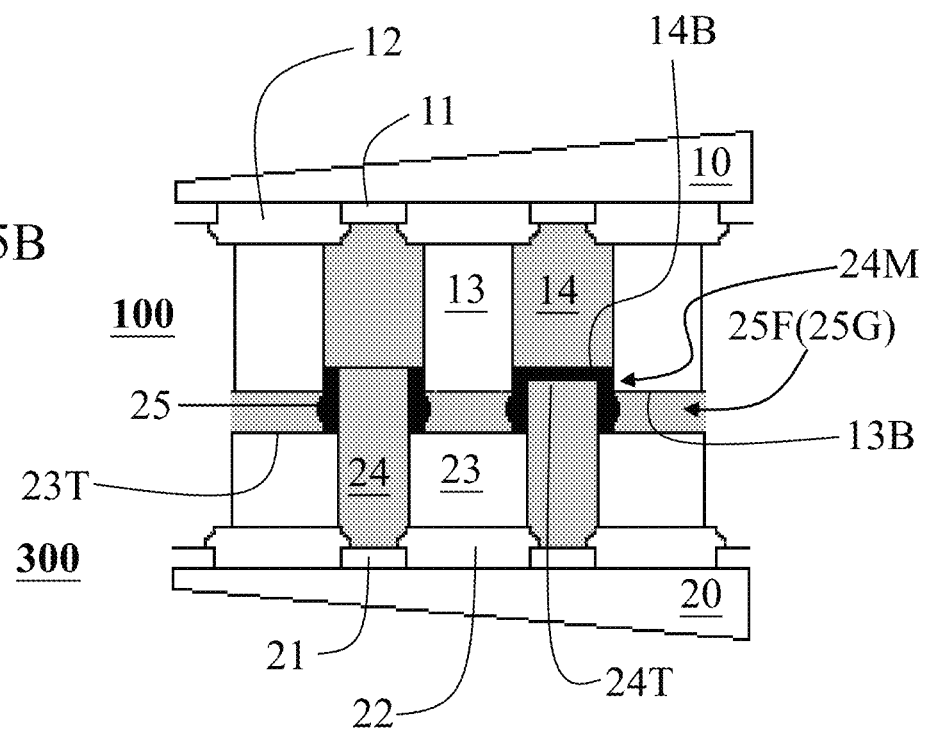
FIG. 5B shows joining the female structure to the male structure according to the present invention.

FIG. 5B shows joining the female structure to the male structure according to the present invention.

FIG. 5B shows

Joining the female structure 100 to the male structure 300 through a metal block 25 (in section view). The metal block 25, filling in the circular gap 13G and the gap 24G, connects the bottom surface of the first metal pillar 14; and the metal block 25 wraps around a side surface of the protrusion of the second metal pillar 24. Metal block 25 has side surface exposes in the gap 24G. The metal block 25 can be formed by electroless metal deposition, alternatively the metal block 25 can be solder which can be formed by screen printing of solder paste, the solder paste can be one of Tin or Tin-Silver (Sn—Ag) alloy.

Either the first metal pillar or the second metal pillar is typically copper pillar, but not limited to copper metal; and the metal block 25 is a metal selected from a group consisting of Cu, Ni, Au. The metal block 25 can be solder such as Sn, or Sn—Ag. FIG. 5B shows an underfilling material 25F can be optionally filled into the gap 25G.

Figure 6A:
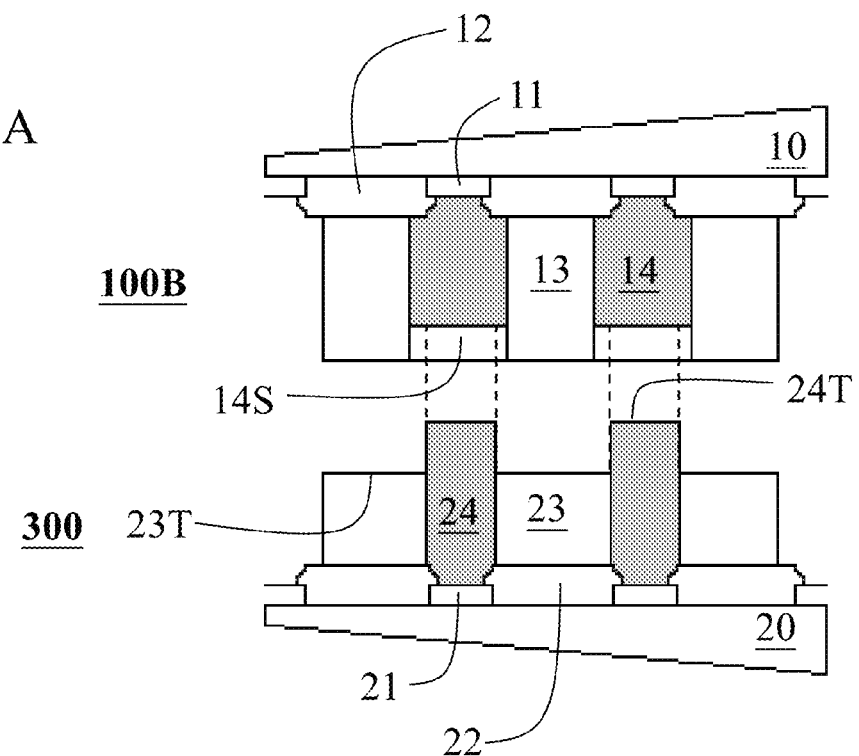
FIG. 6A shows matching a modified female structure to a male structure according to the present invention.

FIG. 6A shows a modified female structure according to the present invention.

FIG. 6A shows, based on a structure of FIG. 4A:

Filling solder 14S in the blind hole 14C of the FIG. 4A so that a modified female structure 100B with solder tip 14S on bottom of the metal pillar 14 is formed. A male structure 300 on bottom side of the female structure is prepared to match with the modified female structure 100B. The solder 14S can be one of Sn or Sn—Ag.

A fabrication process for making the modified female structure 100B is shown in FIGS. 7A~8C.

Figure 6B:
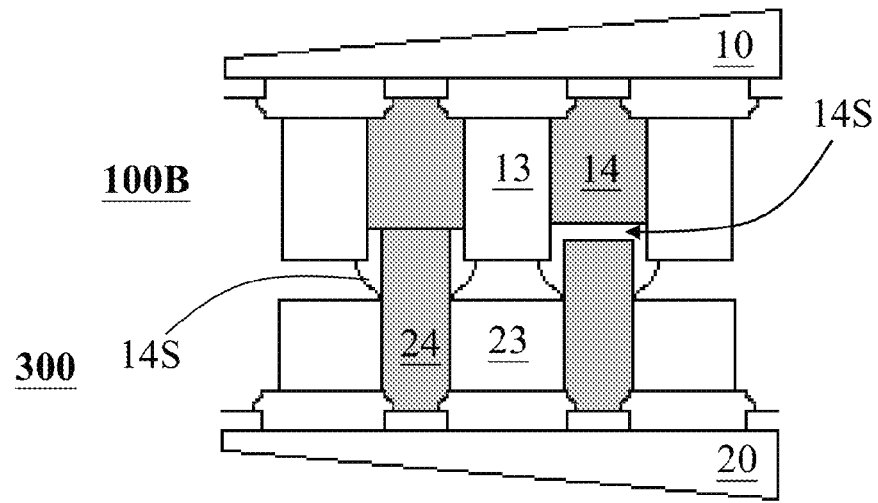
FIG. 6B shows joining the modified female structure to the male structure according to the present invention.

FIG. 6B shows joining the modified female structure to the male structure according to the present invention.

FIG. 6B shows

Reflowing the matched pair of FIG. 6A so that the first metal pillar 14 electrically couples to the second metal pillar 24 through reflowed solder 14S.

FIGS. 7A~8C show a process for fabrication of the modified female structure according to the present invention.

Figure 7A:
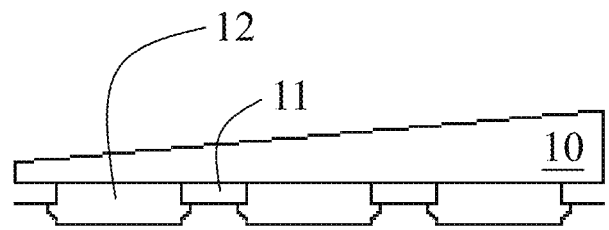
FIGS. 7A~8C show a process for fabrication of the modified female structure according to the present invention.
Figure 7B:
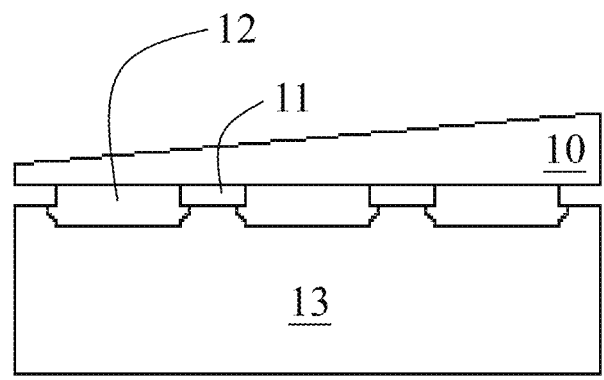
Figure 7C:
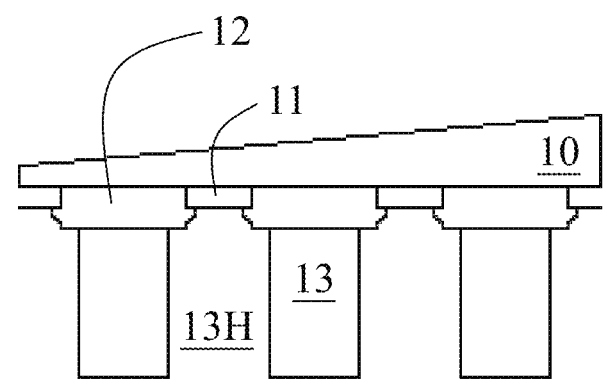
Figure 7D:
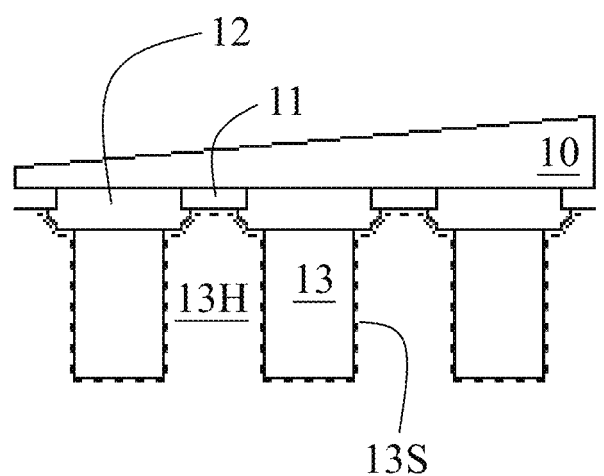
Figure 8A:
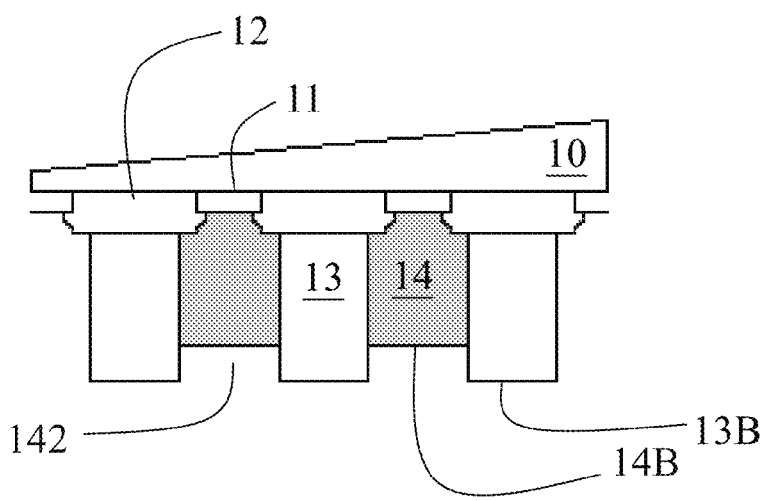
Figure 8B:
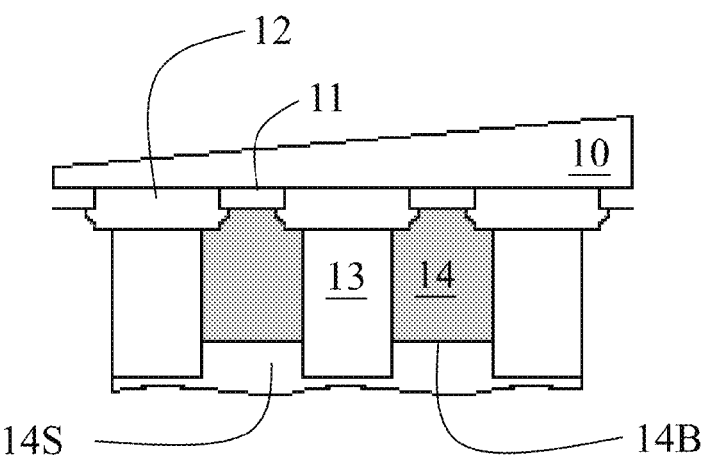
Figure 8C:
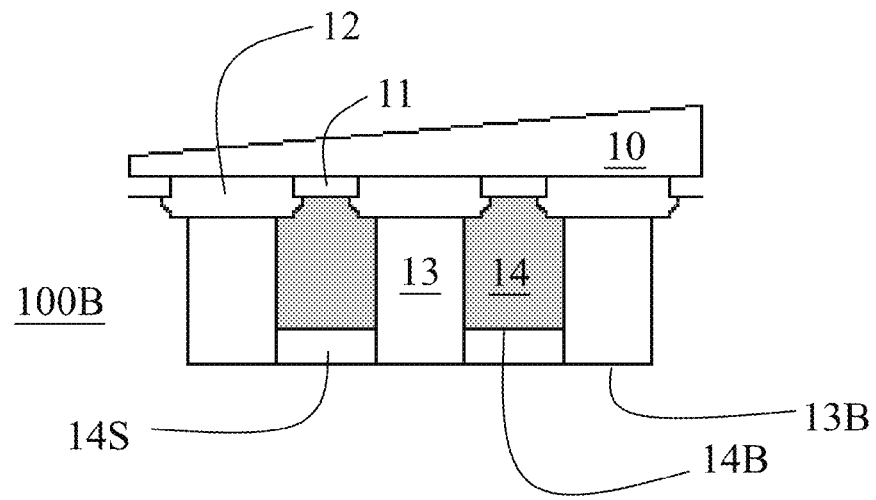

FIGS. 7A~7D are the same as FIG. 2A~2D, omitted to describe hereinafter. FIGS. 8A~8C are described as follows:

FIG. 8A shows, based on a structure of FIG. 7D:

Plating to form a plurality of metal pillars 14; stopping at a predetermined level not full filling the hole 13H. A blind hole 142 is reserved on a bottom side of each metal pillar 14 so that a bottom surface 14B of the metal pillar 14 is higher than a bottom surface 13B of the dielectric material 13.

FIG. 8B shows

Plating to fill solder in each blind hole 142. Alternatively, solder 14S can be filled in each blind hole 142 through screen printing of solder paste.

FIG. 8C shows

Flattening bottom surface from bottom to remove excessive solder through grounding or chemical mechanical polishing (CMP) so that a bottom surface of the dielectric material 13 and a bottom surface of solder 14S are coplanar. The modified female structure 100B with solder 14S on bottom of metal pillar 14 is formed.

While several embodiments have been described by way of example, it will be apparent to those skilled in the art that various modifications may be configured without departs from the spirit of the present invention. Such modifications are all within the scope of the present invention, as defined by the appended claims.

| Numerical system | |
| --- | --- |
| 10 | electronic component |
| 100 | female structure |
| 100B | modified female structure |
| 11 | metal pad |
| 12 | passivation layer |
| 13 | photoresist layer |
| 13B | bottom surface of photoresist layer |
| 13G | circular gap |
| 13H | hole |
| 13S | seed layer |
| 14 | metal pillar |
| 14B | bottom surface of coper pillar |
| 14C | blind hole |
| 142 | blind hole |
| 14S | solder |
| 20 | electronic component |
| 21 | metal pad |
| 22 | passivation layer |
| 23 | photoresist layer |
| 23T | top surface of dielectric layer |
| 24 | metal pillar |
| 24T | top surface of metal pillar |
| 25 | metal block |
| 25F | underfilling dielectric material |
| 25G | gap |
| 300 | male structure |

What is claimed is:
1. A joint structure for metal pillars comprises:
a plurality of female structures configured on a bottom side of a first electronic component, each female structure comprising
a first metal pillar configured on a bottom side of the first electronic component;
a first dielectric material embedding the first metal pillar; and
a blind hole configured on a bottom side of the first dielectric material;
a plurality of male structures configured on a top side of a second electronic component, each male structure comprising
a second metal pillar configured on a top side of the second electronic component; and a second dielectric material embedding the second metal pillar; a protrusion of the second metal pillar configured above the top surface of the second dielectric material, wherein each female structure is electrically coupled to a corresponding male structure; each protrusion of the second metal pillar of a male structure is inserted into a corresponding blind hole of the first female structure, so that the first metal pillar contacts a corresponding second metal pillar; and a metal block contacts the bottom surface of a corresponding first metal pillar and wraps around a side surface of the protrusion of a corresponding second metal pillar.

2. A joint structure for metal pillars as claimed in claim 1, wherein a diameter of the first metal pillar of the female structure is greater than a diameter of the second metal pillar of the male structure.

3. A joint structure for metal pillars as claimed in claim 2, wherein a diameter of the blind hole is the same as a diameter of the first metal pillar of the female structure.

4. A joint structure for metal pillars as claimed in claim 3, wherein a circular gap configured between the first dielectric material and a corresponding second metal pillar within the blind hole.

5. A joint structure for metal pillars as claimed in claim 4, wherein the metal block filling in the circular gap; and the metal block contacts the bottom surface of a corresponding first metal pillar of the female structure.

6. A joint structure for metal pillars as claimed in claim 5, wherein the metal block wrapping around the side surface of the protrusion of a corresponding second metal pillar of the male structure.

7. A joint structure for metal pillars as claimed in claim 6, wherein a depth of the blind hole is smaller than a height of the protrusion of the second metal pillar, so that a gap configured between a bottom surface of the first dielectric material of the female structure and a top surface of the second dielectric material of the male structure.

8. A joint structure for metal pillars as claimed in claim 7, wherein the metal block wraps around side surface of the protrusion of a corresponding second metal pillar in the gap between the first dielectric material and the second dielectric material.

9. A joint structure for metal pillars as claimed in claim 8, wherein a side surface of the metal block exposes in the gap between the bottom surface of the first dielectric material of the female structure and the top surface of the second dielectric material of the male structure.

10. A joint structure for metal pillars as claimed in claim 1, wherein the metal block is a solder filling in the blind hole.

11. A process for fabricating a plurality of metal pillars embedded in a dielectric layer, comprises:

(1) preparing a first electronic component with a plurality of first metal pads on bottom;

(2) forming photoresist layer on bottom side of the plurality of first metal pads;

(3) forming a plurality of holes, each hole exposes a bottom surface of a corresponding first metal pad;

(4) forming seed layer on a surface of the plurality of holes;

(5) plating to form a plurality of first metal pillars;

(6) flattening the plurality of first metal pillars from bottom, so that each bottom surface of a corresponding metal pillar among the plurality of metal pillars is coplanar with a bottom surface of the photoresist layer;

(7) etching the plurality of first metal pillars from bottom to form a plurality of female structures; wherein a height of each first metal pillar is smaller than a height of the first dielectric layer formed by the photoresist layer, and a blind hole configured under a bottom side of a corresponding first metal pillar;

(8) providing a plurality of male structures formed on a second electronic component with a plurality of second metal pillars embedded in a second dielectric layer, wherein the second dielectric layer is etched from bottom to expose the plurality of second metal pillars, so that each second metal pillar is protruded above a top surface of the second dielectric material to form a protrusion;

(9) matching the plurality of female structures to the plurality of male structures, wherein each protrusion inserts into a corresponding blind hole; and

(10) forming a plurality metal block, each metal block contacts a bottom surface of a corresponding first metal pillar, and each metal block wraps side surface of a protrusion of a corresponding second metal pillar.

12. A process as claimed in claim 11, wherein a diameter of the blind hole is the same as a diameter of the first metal pillar of the female structure.

13. A process as claimed in claim 11, wherein the metal block is formed by electroless deposition.

14. A process as claimed in claim 11, wherein the metal block is a reflowed solder.

* * * * *